United States Patent [19]

Froncisz et al.

[11] 4,446,429

[45] May 1, 1984

[54] MICROWAVE RESONATOR

[75] Inventors: Wojciech Froncisz, Cracow, Poland; James S. Hyde, Dousman, Wis.

[73] Assignee: Medical College of Wisconsin, Milwaukee, Wis.

[21] Appl. No.: 310,231

[22] Filed: Oct. 9, 1981

[51] Int. Cl.³ .......................................... G01R 33/08
[52] U.S. Cl. .................................. 324/316; 333/219; 333/235
[58] Field of Search ............... 333/219, 222, 227, 235; 334/41, 45, 78, 82, 89; 324/316, 318; 336/178

[56] References Cited

U.S. PATENT DOCUMENTS

| | | | |
|---|---|---|---|
| 2,227,846 | 1/1941 | Rust | 333/222 |
| 2,629,050 | 2/1953 | Peters, Jr. | 334/78 X |
| 2,996,610 | 8/1961 | Relis | 333/235 X |

OTHER PUBLICATIONS

Mehring et al., *A Slotted Tube Resonator STR for Pulsed ESR and ODMR Experiments*, J. Phys. E. Sci. Instrum, vol. 13, No. 8, Aug. '80.

*Primary Examiner*—Paul L. Gensler
*Attorney, Agent, or Firm*—Barry E. Sammons

[57] ABSTRACT

A microwave resonator is formed by a cylindrical conductive loop and one or more gaps which extend along its length. The loop forms an inductive element and the gaps form capacitive elements which determine the resonant frequency. The loop is surrounded by a conductive shield which improves the quality factor (Q) of the resonator and high frequency radio signals are coupled to the resonator by an inductive loop positioned at one of its ends.

14 Claims, 8 Drawing Figures

MICROWAVE RESONATOR

GOVERNMENT RIGHTS

The invention described herein was made in the course of work under a grant or award from the Department of Health and Human Services. This invention was also made with Government support under PCM-78-23206 awarded by the National Science Foundation. The Government has certain rights in this invention.

BACKGROUND OF THE INVENTION

The field of the invention is radio frequency resonators, and particularly, resonators employed in gyromagnetic resonance spectroscopy.

Gyromagnetic resonance spectroscopy is conducted to study nuclei that have a magnetic moment, which is called nuclear magnetic resonance (NMR) and electrons which are in a paramagnetic state which is called paramagnetic resonance (EPR) or electron spin resonance (ESR). There are also a number of other forms of gyromagnetic spectroscopy that are practiced less frequently, but are also included in the field of this invention. In gyromagnetic resonance spectroscopy a sample to be investigated is subjected to a polarizing magnetic field and one or more radio frequency magnetic fields. The frequency, strength, direction, and modulation of the magnetic fields varies considerably depending upon the phenomena being studied. Apparatus such as that disclosed in U.S. Pat. Nos. 3,358,222 and 3,559,043 has been employed for performing such experiments in laboratories, but widespread commercial use of gyromagnetic resonance spectroscopy techniques has been limited.

The reason for the limited commercial application of gyromagnetic resonance spectrometers is their complexity and high cost. Very high radio frequencies are required for some measurement techniques (such as electron spin resonance meaurements) and very strong polarizing magnetic fields are required for others (such as nuclear magnetic resonance). In addition, the physical structures for applying multiple fields to a specimen are complex, particularly when the temperature of the specimen is to be controlled, or the specimen is to be irradiated with light during the measurement.

A split-ring resonator has recently been proposed by W. N. Hardy and L. A. Whitehead for use at radio frequencies between 200 and 2000 MHz. This resonator is characterized by its uncomplicated structure, its high filling factor (magnetic energy stored in the specimen region divided by the total stored magnetic energy) and its small size. Although this proposed structure offers many advantages over prior resonators employed in gyromagnetic resonance spectrometers, it is limited at higher frequencies and it is difficult to properly apply additional magnetic fields to a specimen contained within the split-ring resonator.

SUMMARY OF THE INVENTION

The present invention relates to a resonator comprised of a conductive loop that encircles a central axis and in which the conductive loop contains a plurality of gaps that divide it into a plurality of separate segments. A lumped circuit resonator is formed in which the conductive loop is the inductive element and the gaps form capacitive elements which determine the resonant frequency of the device. A specimen may be placed within the conductive loop and a high frequency magnetic field may be applied to it along the central axis. Because of the plurality of gaps, the inductive element is divided into a number of electrically insulated segments. This is of great convenience in applying oscillating magnetic fields to the specimens.

A general object of the invention is to provide a resonator which may be tuned to high frequencies. The resonant frequency is increased by adding gaps to the conductive loop. Where there are n identical gaps, the resonant frequency is $\sqrt{n}$ times the resonant frequency with one gap. The size of the gaps can be varied and dielectric materials can be inserted in the gaps to further adjust the resonant frequency.

Another object of the invention is to apply a high intensity radio frequency magnetic field to a specimen without generating excessive heat. By symmetrically positioning the gaps about the central axis, the electric field created by the radio frequency generator can be minimized in a region about the central axis. Since it is the electric field which generates heat in many specimens, by placing the specimen in this low intensity region, high intensity electromagnetic energy can be applied without heating the specimen. This reduction of heating is particularly important when investigating aqueous samples such as those of biological interest.

Another object of the invention is to provide a resonator in which mechanical resonance due to the application and interaction of multiple magnetic fields is minimized. By providing a plurality of gaps in the conductive loop, it is broken into smaller conductive segments which reduce the flow of eddy currents induced by the application of high frequency modulated magnetic fields. In addition, the smaller conductive segments preclude the occurrence of standing acoustic waves, which may otherwise modulate the dimensions of the resonator and produce spurious resonance effects.

Another object of the invention is to provide a resonator which may be easily manufactured. For lower frequency applications the conductive loop can be manufactured as two separate metal pieces. These can be precisely machined and polished so that when they are combined to form the resonator ring, the gaps formed by them can be made very small to provide a low resonant frequency. In other applications, the conductive loop can be formed by depositing a layer of conductive material on a dielectric ring. The gaps may then be formed by removing portions of the conductive layer from the dielectric ring. This process may be easily performed with automated equipment in which conductive material is removed until the device resonates at the desired frequency.

Another object of the invention is to provide a resonator which can be tuned. This is accomplished by inserting a dielectric material in one or more of the gaps. The dielectric material alters the capacitance of the lumped element resonator and hence its resonant frequency.

Another object of the invention is to provide a resonator which improves the sensitivity of the spectrometer. The resonator has a relatively high quality factor (Q) and a high filling factor. At higher frequencies the Q is further enhanced by a shield which surrounds the conductive loop.

Another object of the invention is to provide a resonator that is physically small as compared with cavity resonators operating at the same frequency. This enables the use of smaller polarizing magnets in gyromagnetic resonance spectroscopy while maintaining the requisite field strength. This reduction in size substantially reduces the cost of the spectrometer.

Yet another object of the invention is to provide a resonator which supports a more intense radio frequency magnetic field for a given amount of available radio frequency power.

The foregoing and other objects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims herein for interpreting the scope of the invention.

DESCRIPTION OF THE PREFERRED EMBODIMENT

Figure 1:
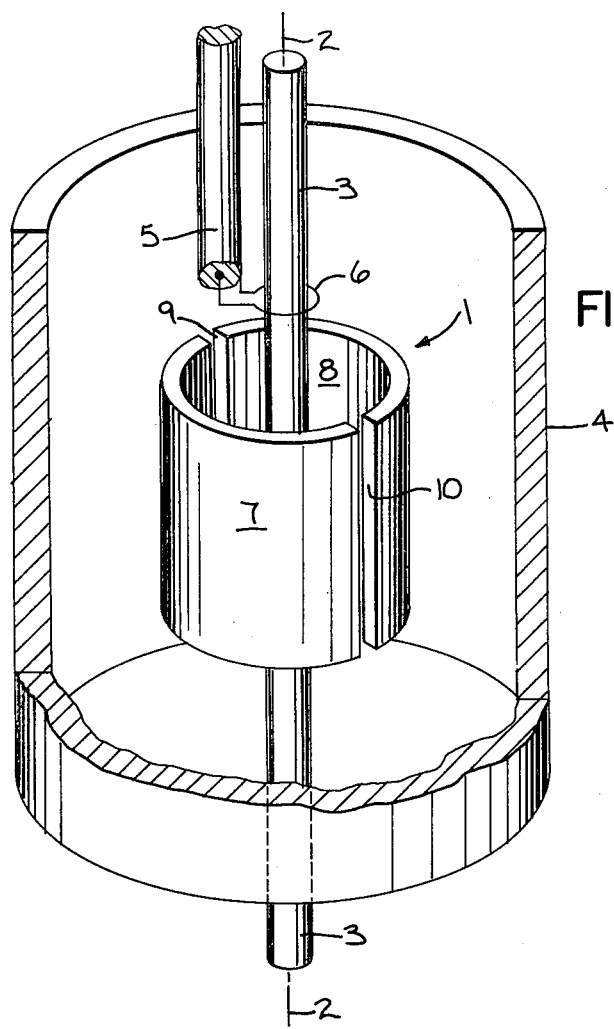
FIG. 1 is a perspective view with parts cut away of a spectrometer system which employs the present invention.
Figure 2:
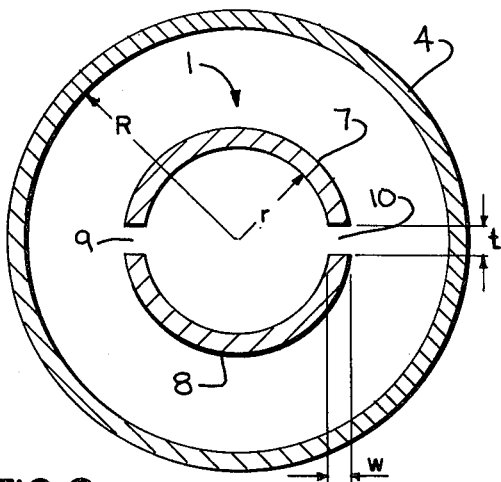
FIG. 2 is a top view of the resonator and surrounding shield which forms part of the system of FIG. 1.

Referring particularly to FIGS. 1 and 2, a gyromagnetic resonance spectrometer includes a two-piece, circular cylindrical metal resonator 1 which is aligned along a vertical central axis 2. A tube 3 containing a sample, or specimen, to be tested is inserted through the resonator 1 and a circular cylindrical shield 4 is disposed around the resonator 1. A coaxial cable 5 which connects to a high frequency radio source (not shown in the drawings) has a loop 6 formed at its end, and this loop is positioned adjacent one end of the resonator 1. The electromagnetic field produced by the loop 6 is inductively coupled to the resonator 1, and the degree of coupling can be controlled by adjusting the axial location of the loop 6. A polarizing magnetic field may also be applied to the resulting structure by a large magnet, and field modulation coils may be positioned at locations appropriate for the measurement being conducted. Indeed, it is an important advantage of the present invention that the specimen contained within the tube 3 may be easily subjected to numerous fields of varying strength and orientation in order to implement a wide variety of measurement techniques.

Referring still to FIGS. 1 and 2, the resonator 1 is a lumped circuit cavity resonator which resonates at a radio frequency determined by its geometry. In contrast to distributed circuit cavity resonators, the lumped circuit resonator 1 of the present invention has dimensions which are much less than the wavelength of the radio frequency signal at which it resonates. An additional characteristic of this lumped circuit resonator is that the capacitive and inductive elements are identifiable and the electromagnetic energy oscillates between a magnetic field generated by the inductive element and an electric field generated by the capacitive element.

These characteristics provide a number of advantages. The inductive element in the resonator 1 is the loop, or ring, formed by two metallic pieces 7 and 8, and the capacitive element is the longitudinal gaps 9 and 10 formed at the juncture of the two pieces 7 and 8. The magnitude of the magnetic field produced by the resonator 1 is maximum along the central axis 2, and the electric field which it produces is maximum at the gaps 9 and 10. A specimen which is positioned along the central axis 2, therefore, is subject to a high level magnetic field and a low level electric field. This is very desirable in gyromagnetic resonant spectroscopy since it is the magnetic field intensity which is required to promote gyromagnetic resonance phenomena. Indeed, it is a characteristic of the resonator 1 that the "filling factor" is very high thus providing a very sensitive measurement instrument. The filling factor is the ratio of total magnetic energy in the space occupied by the specimen divided by the total magnetic energy in the resonator, and the higher the folling factor, the better is the sensitivity.

Although there are many possible variations in the shape and size of the resonator 1 it is particularly suited for radio frequencies in the microwave region of the spectrum. As will become apparent from the description below, the resonator of the present invention can be constructed to resonate over a very wide range of frequencies, making it applicable not only to a large number of gyromagnetic resonance measurement techniques, but also to microwave communications in general.

As shown particularly in FIG. 2, the basic resonator 1 of the present invention is comprised of a conductive loop formed by two metallic pieces 7 and 8. The pieces 7 and 8 are spaced from one another to form the gaps 9 and 10. The shield 4 surrounds the resonator 1 and its purpose is to suppress electromagnetic radiation to the surroundings and to improve the "Q" of the resonator 1 at the microwave frequencies. This purpose is best served if the radius (R) of the shield 4 is less than one-fourth the wavelength of the resonant frequency. The resonant frequency of the resulting structure is as follows:

$$F = \left[ \frac{1}{2\pi} \left( 1 + \frac{r^2}{R^2 - (r+w)^2} \right)^{\frac{1}{2}} \left( \frac{t}{\pi w \epsilon \mu} \right)^{\frac{1}{2}} \frac{1}{r} \left( \frac{1}{1 + 2.5 \frac{t}{w}} \right)^{\frac{1}{2}} \right] n^{\frac{1}{2}} \quad (1)$$

where:
$\epsilon$ = the dielectric constant of the material in the gaps 9 and 10;
$\mu$ = the permeability of free space; and n = the number of identical gaps in the conductive loop.

The third term in parentheses takes into account the effect of fringing fields near the gaps 9 and 10 on the capacitance. In the limit where $R/r \gg 1$ and the $t/w \ll 1$, this equation reduces to the following:

$$F = \frac{1}{2\pi} \left( \frac{1}{LC} \right)^{\frac{1}{2}} \quad (2)$$

where: $L = \frac{\mu \pi r^2}{Z}$ $$\frac{1}{C} = n \frac{t}{\epsilon w Z} \quad (3)$$

$Z$ = the length of the resonator 1. Note that the length does not affect the resonant frequency.

Table A provides a list of the resonant frequencies and Q of the structure for a number of geometries employing two gaps in the resonator loop.

TABLE A

| F(GHz) | Q    | r     | w     | t     | R     |
|--------|------|-------|-------|-------|-------|
| 3.75   | 1500 | .094" | .092" | .004" | .375" |
| 6.77   | 1230 | .099" | .026" | .006" | .20"  |
| 9.02   | 1800 | .076" | .014" | .006" | .25"  |
| 10.8   | 1080 | .076" | .014" | .006" | .14"  |

It is a fundamental teaching of the present invention that the resonant frequency of the structure can be increased most effectively by increasing the number of gaps in the resonator loop. That is, a substantial change in resonant frequency is best achieved by altering the number of capacitive elements in the structure. The resonant frequency is thus controlled by the value of C in the above equation (2), and the value of C can be expressed generally as follows:

$$\frac{1}{C} = \frac{1}{C_1} + \frac{1}{C_2} + \ldots + \frac{1}{C_n} \quad (4)$$

where: $\frac{1}{C_n} = \frac{t_n}{\epsilon w_n Z}$ $t_n$ = gap spacing
$w_n$ = gap width Table B provides a list of the resonant frequencies and Q of a resonator in which the number of gaps (n) is varied.

TABLE B

| n | F(GHz) | Q    | r     | w     | t     | R     |
|---|--------|------|-------|-------|-------|-------|
| 1 | 4.42   | 1100 | .099" | .026" | .006" | .200" |
| 2 | 6.77   | 1230 | .099" | .026" | .006" | .200" |
| 4 | 9.79   | 1150 | .099" | .026" | .006" | .200" |

Figure 4:
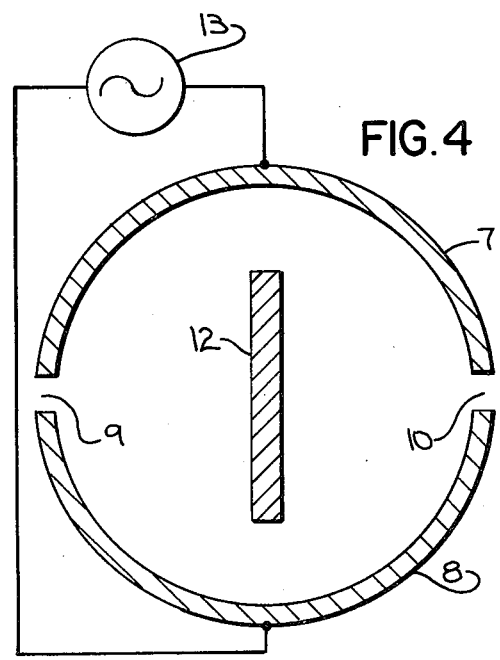
FIG. 4 is a top view of the resonator of FIG. 2 illustrating the placement of a sample for minimum heating.

Referring particularly to FIG. 4, the symmetry which results from the use of an even number of gaps in the resonator 1 is particularly useful in a number of gyromagnetic resonance measurement techniques. In the two-gap embodiment shown in FIG. 4 for example, a second radio frequency electromagnetic field can easily be applied to a specimen 12 by electrically connecting a radio frequency generator 13 to the metallic ring pieces 7 and 8. The appropriate points of attachment are midway between the gaps, at which points the electric potential is zero. This is used in a technique known as electron nuclear double resonance (ENDOR) in which the radio frequency generator 13 is swept through a frequency range that corresponds to the resonant frequencies of nuclei that are coupled to unpaired electrons.

Figure 5:
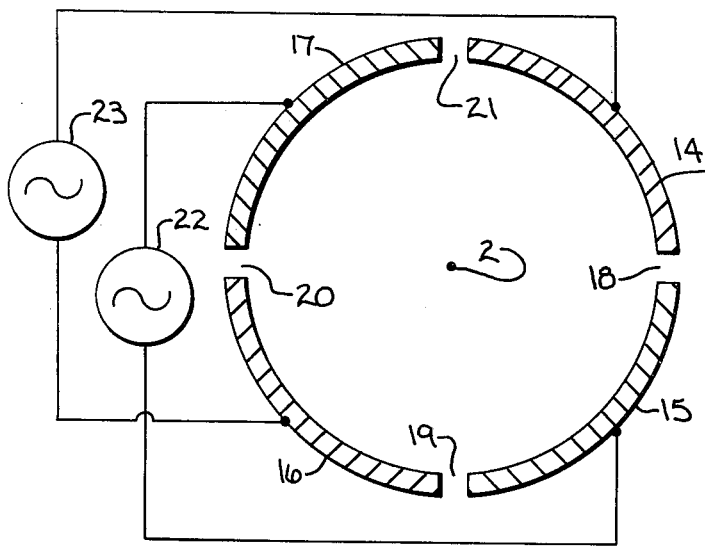
FIG. 5 is a top view of a third alternative embodiment of the resonator.

As shown in FIG. 5, the same concept can be extended to resonators with additional gaps. In the embodiment of FIG. 5, the metallic resonator loop is divided into four ring pieces 14, 15, 16 and 17 by a set of four gaps 18, 19, 20 and 21 which are disposed in quadrature about the central axis 2. A pair of radio frequency generators 22 and 23 are connected to the respective ring pieces 15 and 17, and 14 and 16. The resulting orthogonal magnetic fields are useful in gyromagnetic resonance measurement techniques which require triple resonance.

When a single gap is formed in the resonator ring, as described in the W. N. Hardy and L. A. Whitehead publication in "Review of Scientific Instruments" 55, 213 (1981), the construction of the resonator is straightforward. In such constructions, a metal tube, or sleeve, is cut to length and a single longitudinal cut is made to form the single gap. An integral unit remains when a single cut is made, and although it is difficult to provide a small gap space (t), this construction technique is suitable for many applications, particularly in the field of nuclear magnetic resonance(NMR) spectroscopy.

In addition to our discovery that a plurality of gaps formed in the resonator ring will substantially improve its performance in many applications, the present invention relates to a number of improvements to both single gap resonator constructions and multi-gap resonators.

Figure 3:
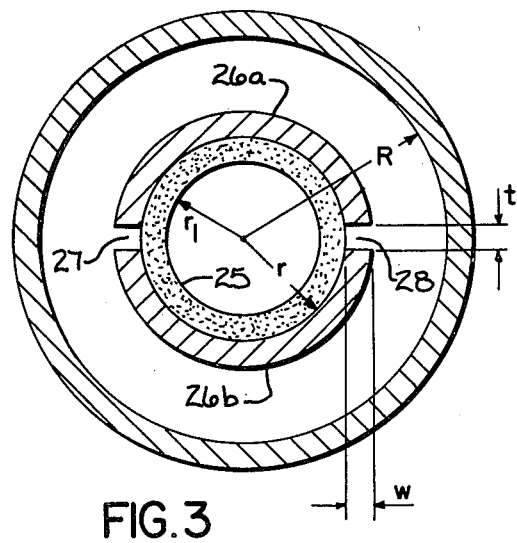
FIG. 3 is a top view of an alternative embodiment of the resonator and shield which may be employed in the system of FIG. 1.

Referring particularly to FIG. 3, a preferred construction of the resonator for commercial applications include a circular cylindrical supporting sleeve 25 which is formed from an electrically insulating material. Quartz is the preferred material for this purpose because it has a low dielectric loss and an unusually low thermal coefficient of expansion. The resonator loop 26a and 26b is then formed by applying a layer of conductive material to the outer surface of the quartz substrate 25 and cutting longitudinal grooves in the conductive layer to form the gaps 27 and 28. This process may be automated, with one or more gaps being formed by several cutting passes and with tests of the resonant frequency being made between passes. Table C is a list of the resonant frequency and Q of several constructions using silver and copper conductive layers of various thicknesses.

TABLE C

| Material | r    | $r_1$ | R  | w     | t    | z  | F(GHz) | Q    |
|----------|------|-------|----|-------|------|----|--------|------|
| Silver   | .155 | .125  | .4 | .0018 | .01  | .4 | 9.852  | 660  |
| Silver   | .152 | .180  | .4 | .0007 | .005 | .3 | 10.490 | 310  |
| Copper   | .154 | .165  | .4 | .0257 | .01  | .4 | 9.418  | 1570 |

Figure 6:
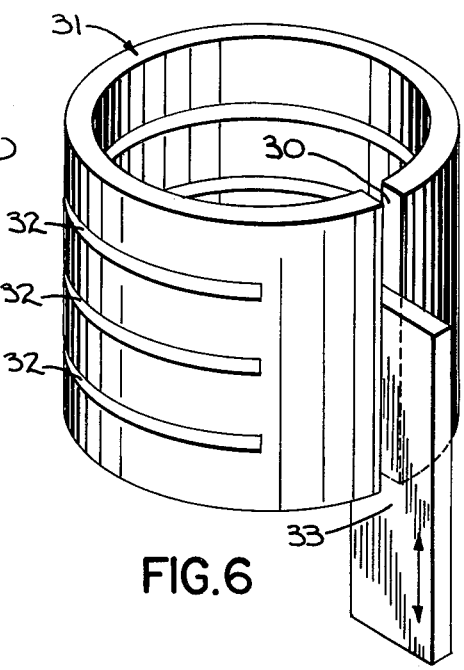
FIG. 6 is a perspective view of a fourth alternative embodiment of the resonator.
Figure 7:
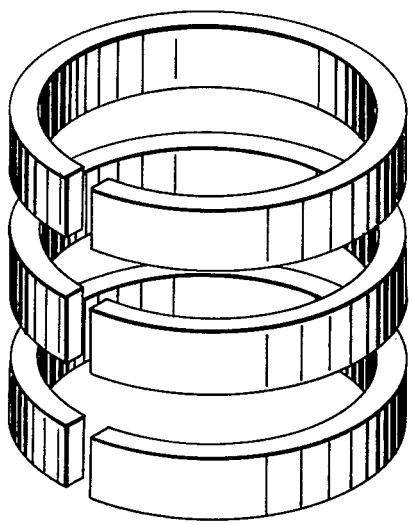
FIG. 7 is a perspective view of a variation of the microwave resonator of FIG. 6.

Although the resonator of the present invention is suitable for a wide variety of applications, there are a number of unique constructions which make it particularly applicable to electron spin resonance (ESR) measurements. Referring particularly to FIG. 6, a single gap resonator is formed by cutting a single longitudinal groove 30 in a circular, cylindrical metal sleeve 31. A series of transverse cuts 32 are also made in the metal sleeve 31 and a sheet of insulating material 33 is positioned in the gap 30. The transverse slots 32 enable a modulated polarizing magnetic field (for example 100 KHz) to penetrate the resonator 31 to reach the specimen contained therein, and they also serve to reduce eddy currents which are induced in the sleeve 31 by such magnetic fields. In addition, the transverse cuts 32 of this embodiment and the longitudinal cuts of the other embodiments prevent the occurrence of standing waves at the lower, modulation frequency. Such standing waves can create forces which produce slight mechanical motions that in turn introduce spurious oscillations into the system. In applications where this is a particular problem the transverse slots may be extended completely around the loop to form a structure such as that shown in FIG. 7.

Referring still to FIG. 6, the resonant frequency of the resonator can be adjusted by changing the effective dielectric constant ($\epsilon$) in the longitudinal gap 30. The insulating material 33 has a high dielectric constant (sapphire is preferred) and the resonator can be tuned over a relatively wide frequency range by moving this material 33 within the gap 30 to change the value of the resonator capacitive element. It is notable that the filling factor is not substantially altered when the resonant frequency is tuned in this manner.

Figure 8:
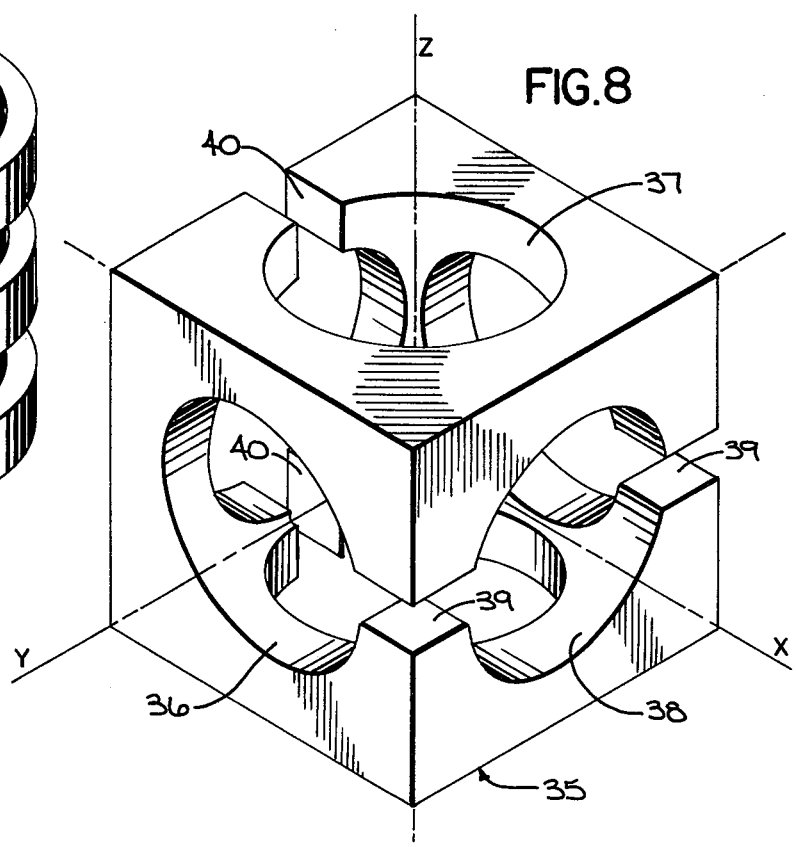
FIG. 8 is a perspective view of a fifth alternative embodiment of the resonator.

Referring particularly to FIG. 8, another resonator construction is shown in which orthogonal resonators are formed in a block of conductive material. In the preferred embodiment the block 35 is cubical in shape and three orthogonal circular openings 36-38 are drilled through its faces. A slot 39 is cut along one face to intersect along the longitudinal length of the opening 38 and a slot 40 is cut in the opposite face to intersect the longitudinal length of the opening 37. A first single gap resonator is thus formed with its central axis coincident with a Y axis, and a second single gap resonator is formed with its central axis coincident with a Z axis. A specimen may be inserted into the resonator along the X axis and irradiated with microwaves of two different frequencies. Also, measurements which employ the Block induction technique may be performed with this structure. In such measurements a specimen is irradiated with a magnetic field coupled to one of the resonators, and energy is coupled to the second resonator cavity by the specimen.

A number of resonator structures have been disclosed which are particularly suited for gyromagnetic resonance spectrometers. However, it should be apparent to those skilled in the art that the resonator of the present invention also has application to other arts which employ high frequency resonators. In addition, the resonators disclosed herein are circular cylindrical in shape, but other shapes are also possible. Accordingly, the term "loop" as used in the following claims includes all shapes which enclose the central longitudinal axis and which define an opening extending completely through the loop along that axis.

We claim:

1. A lumped circuit resonator for gyromagnetic resonance spectrometers which comprises:
   a loop formed from an electrically conductive material and being disposed around a central longitudinal axis, said loop having a length in the direction of the central longitudinal axis;
   a plurality of gaps formed along the length of the loop to divide the loop into a plurality of separate pieces, wherein the number and size of the gaps are selected to tune the resonator to a desired resonant frequency; and
   wherein electromagnetic energy is coupled to the lumped circuit resonator and a magnetic field is produced along the central longitudinal axis of the loop at the resonant frequency and is applied to a sample to be investigated.

2. The lumped circuit resonator as defined in claim 1 in which the gaps are positioned around the loop to maintain symmetry of the resonator about a plane which includes the central axis.

3. The lumped circuit resonator as defined in claim 1 in which the loop is formed as a layer of metal supported on a cylindrical sleeve made of an electrically insulating material.

4. The lumped circuit resonator as defined in claim 1 in which
   a metal shield is disposed around the loop and its distance from the central axis is selected to increase the quality factor of the resonator.

5. The lumped circuit resonator as recited in claim 1 in which a first radio frequency signal is inductively coupled to the resonator at one end of the loop and a second radio frequency generator is electrically connected to separate pieces of the loop.

6. The lumped circuit resonator as recited in claim 1 in which a sheet of high dielectric material is disposed in one of said gaps and is movable within said one gap to tune the frequency of the resonator.

7. The lumped circuit resonator as recited in claim 6 in which said sheet of high dielectric material is made of sapphire.

8. The lumped circuit resonator as recited in claim 4 in which a radio frequency signal is inductively coupled to the resonator at one end of the loop and means is provided for adjusting the strength of the induced signal.

9. A lumped circuit resonator for use in gyromagnetic resonance spectrometers, the combination comprising:
   a loop formed from an electrically conductive material and being disposed around a central longitudinal axis, said loop having a gap formed along its entire length which causes the loop to resonate at a selected frequency and a transverse slot formed around its perimeter to enable radio frequency signals to penetrate the resonator;
   means for inducing a radio frequency signal at the selected resonant frequency, including a loop of conductive wire positioned adjacent one end of the loop and encircling the central axis; and
   a metal shield disposed outward from the loop at a distance which is selected to increase the quality factor of the resonator.

10. The lumped circuit resonator is recited in claim 9 in which the loop is circular cylindrical in shape.

11. The lumped circuit resonator as recited in claim 10 in which the metal shield is circular cylindrical in shape and its radius is less than one-fourth the wavelength of the induced radio frequency signal.

12. The lumped circuit resonator as recited in claim 9 in which the length of the loop is substantially less than the wavelength of the induced radio frequency signal.

13. A lumped circuit resonator for gyromagnetic resonance spectrometers which comprises:
   a block formed from an electrically conductive material;
   a first resonator formed by a cylindrical opening extending through the block along a first central axis, and a gap formed in the block and intersecting the cylindrical opening along its entire length; and
   a second resonator formed by a second cylindrical opening extending through the block along a second central axis which intersects the first resonator and a second gap formed in the block and intersecting the second cylindrical opening along its entire length;

whereby a specimen located at the intersection of the two resonators is subjected simultaneously to magnetic fields at the resonant frequencies of the respective resonators.

14. The lumped circuit resonator as recited in claim 13 in which the block is a cube and the resonators intersect each other at a substantially right angle.

* * * * *